United States Patent [19]

Nicolas

[11] 4,031,612
[45] June 28, 1977

[54] METHOD AND A DEVICE FOR THE INTERCONNECTION OF ELECTRONIC COMPONENTS

[75] Inventor: Gérard Nicolas, Grenoble, France

[73] Assignee: Commissariat a l'Energie Atomique, Paris, France

[22] Filed: Mar. 2, 1976

[21] Appl. No.: 663,250

[52] U.S. Cl. .............................. 29/625; 29/564.4; 29/628
[51] Int. Cl.² ......................................... H05K 3/00
[58] Field of Search ..... 29/203 B, 203 D, 203 MW, 29/625, 628

[56] References Cited

UNITED STATES PATENTS

| 3,674,914 | 7/1972 | Burr | 29/625 |
| 3,812,581 | 5/1974 | Larson | 29/628 |
| 3,930,524 | 1/1976 | Tarbox | 29/203 MW |

Primary Examiner—Lowell A. Larson
Attorney, Agent, or Firm—Lane, Aitken, Dunner & Ziems

[57] ABSTRACT

Different conductive zones on an insulating base support are interconnected by bonding an insulated wire to the support. In order to establish electric contacts between conductive zones and the conductive core of the insulated wire, the wire is stripped, soldered onto the conductive zones and cut after soldering.

13 Claims, 7 Drawing Figures

METHOD AND A DEVICE FOR THE INTERCONNECTION OF ELECTRONIC COMPONENTS

This invention relates to a method of interconnection of electronic components by means of insulated wires, said components being fixed on a suitably prepared insulating base support.

The invention is also concerned with a device for carrying out the method according to the invention.

It is known that, apart from the problems of fabrication of active components on a substrate, the fabrication of miniaturized circuits entails the interconnection of these components by means of connecting wires.

The aim of the present invention is to provide a very flexible system for interconnecting electronic components as mentioned above, especially for the fabrication of proto-types and pre-production assemblies, by means of a method and a machine for modifying layouts according to requirements and in a very short time.

In one design of the so-called "multiwire" type employed in the prior art, use is made of printed-circuit insulating supports of conventional type on which insulating wires are deposited. After operations which involve pressing of the wires into a synthetic resin, drilling of holes, chemical electrodeposition of copper, tinning and etching of connecting studs, a completely finished and unitized set of connections which is ready to receive the electronic components is accordingly obtained. However, the "multiwire" design which has been described has the disadvantage of depositing the wires at the outset by means of a tracing machine of the "multiwire" type which is programmed by computer and entails high capital cost. This machine has to be installed on the manufacturer's premises and any circuit modifications result in modifications of the machine program. Since the final operations of the "multiwire" process mentioned above are located in time after deposition of the insulating wires, any modifications of the interconnection diagram is a matter of difficulty. Furthermore, supports in the form of standardized cards cannot be prepared beforehand by means of operations consisting of drilling, chemical electrodeposition of copper, tinning, etching and in some cases deposition of adhesive, and performed prior to deposition of the interconnecting insulating wires.

The present invention offers an advantage in that the operation which consists in laying the interconnecting wires can be carried out at the very end of the circuit fabrication process, thus permitting rapid modification of the interconnection diagram in a very flexible manner. Moreover, the standardized cards which are provided with drilled metallized holes, with studs (rectangular lugs), with (circular) pastilles and with etched tracks can be prepared beforehand by means of operations which consist in drilling, chemical electrodeposition of copper, tinning, etching and in some cases deposition of adhesive and preferably on the premises of a specialized manufacturer, with the result that the user can have at his disposal a stock of standardized cards in readiness for interconnection.

Finally, in accordance with the method of the invention, the machine for laying wires or in other words for interconnecting the different circuits can be placed in the user's premises, with the result that the layout of the interconnection diagram can readily be modified immediately before use.

In more exact terms, the present invention is directed to a method of interconnection of components by means of insulated wires on an insulating base support having conductive zones such as metallized holes, etched tracks, pastilles and insulated studs arranged in spaced relation on one face of the support, the etched tracks, the metallized holes, the pastilles and the studs being preferably tinned; in accordance with the invention, there is deposited on one face of the base support a thermosetting adhesive layer which covers the entire surface of the support except for the metallized holes, those points of the etched tracks on which a contact is to be established, the pastilles and the studs, and these different conductive zones are then joined together automatically by means of insulated wire which is pressed into the resin; the contacts are formed by stripping the wire, by soldering said wire onto the aforementioned conductive zones, by cutting said wire after soldering, these three operations being performed by numerical control in order to obtain a multiwire circuit which is ready for use.

In the method in accordance with the invention, the insulating base support is the same as the support employed in printed circuits. The thermosetting adhesive layer is deposited on one face of the base support and intended to endow the insulated wires with mechanical strength. Said adhesive layer covers the entire surface except for the pastiles, the metallized holes, the studs and connectors. The adhesive can be deposited in several ways:

a. in the form of a dry film in which openings (holes corresponding to the conductive zones) have been formed by die-stamping. The film adheres to the support as a result of slight heating or vaporization of a suitable solvent and passing between two rubber rollers. The film is correctly placed by means of conventional methods.

b. the film can be deposited without any particular adjustment of the position of the support or any previous drilling operation; the openings are then formed by chemical etching of the adhesive while protecting this latter with a photosensitive resin deposited by screen process at those points in which it is not desired to attack the thermosetting layer.

This protection resin is then dissolved after attack of the adhesive layer.

c. the adhesive resin is employed in solution and is placed on the circuit directly by screen process.

These different operations are carried out prior to the wire-laying operation proper and the advantage of the method according to the invention again lies in the possibility of constituting a stock of substrates which can be employed for several types of circuit.

It is apparent that the use of a film layer of thermosetting resin is not essential to be practical application of the invention and can be replaced, for example, by a radiosetting layer; it is only necessary to ensure that this layer has the effect of bonding the insulating wire to the support and then preferably loses its adhesive properties over the remainder of the surface, either as a result of conversion of its physical properties by suitable treatment (heating, radiation, for example, or as a result of removal, especially by dissolution. In an alternative embodiment fo the invention, this layer can be dispensed with if the machine which deposits the insulated wire also deposits the adhesive locally or if the wire is coated with adhesive or with a layer which can be rendered adhesive preferably immediately before deposition, thus enabling this latter to adhere to the substrate without any other adhesive layer.

The invention is also concerned with a device for the practical application of the method. Said device comprises an XY table which is displaceable in two perpendicular directions by numerical control for example and on which is fixed an insulating base support provided with an adhesive and especially thermosetting layer except at the locations mentioned earlier. The device in accordance with the invention is essentially provided within a unit which is capable of rotating about an axis located at right angles to the support with means for unwinding and feeding the wire, for orienting the head in the direction of displacement, for stripping and preferably tinning the wire in a controlled manner according to the desired interconnection so that the wire which is preferably heated is applied on said support in addition to means for soldering the wires onto studs and means for cutting the wire after it has been soldered.

Further properties and advantages of the invention will become more readily apparent from the following description of exemplified embodiments which are given by way of explanation without any limitation being implied, reference being made to the accompanying drawings, wherein.

Figure 1:
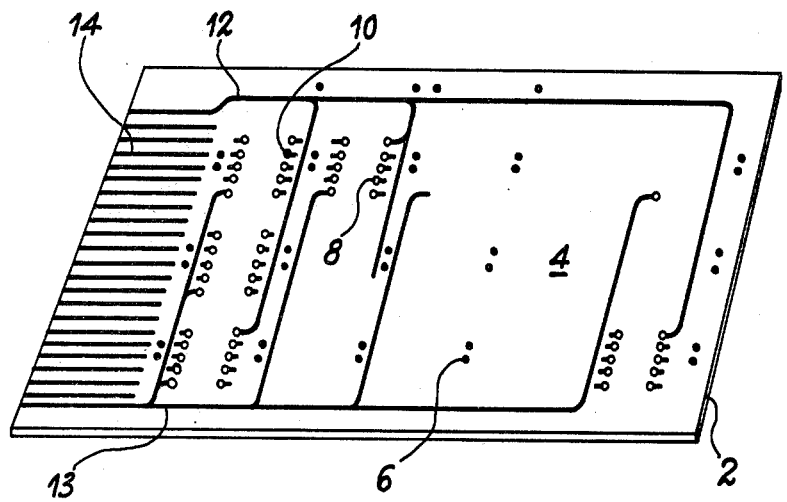
FIG. 1 is a diagram showing the structure of the base support prior to insertion of the insulated wires.

There is shown in FIG. 1 a diagram of the insulating base support 2 which is provided with a certain number of lines and etched studs. This support 2 is entirely coated with adhesive resin at 4 except for the insulated studs such as 6, the pastilles 8, the metallized holes 10. Provision is also made for connectors such as the connector 14 consisting of etched conductive strips which are not coated with resin and formed on the insulating support 2.

The tracks or etched lines serve as ground and supply lines. By way of example, the ground line in FIG. 1 is the line 12 and the etched line 13 is the supply line. The insulated studs and the metallized holes such as those designated by the reference numerals 6 and 10 are employed for forming wired connecting relays or for inserting discrete elements such as resistors or capacitors which are inserted between these different studs and holes.

Figure 2:
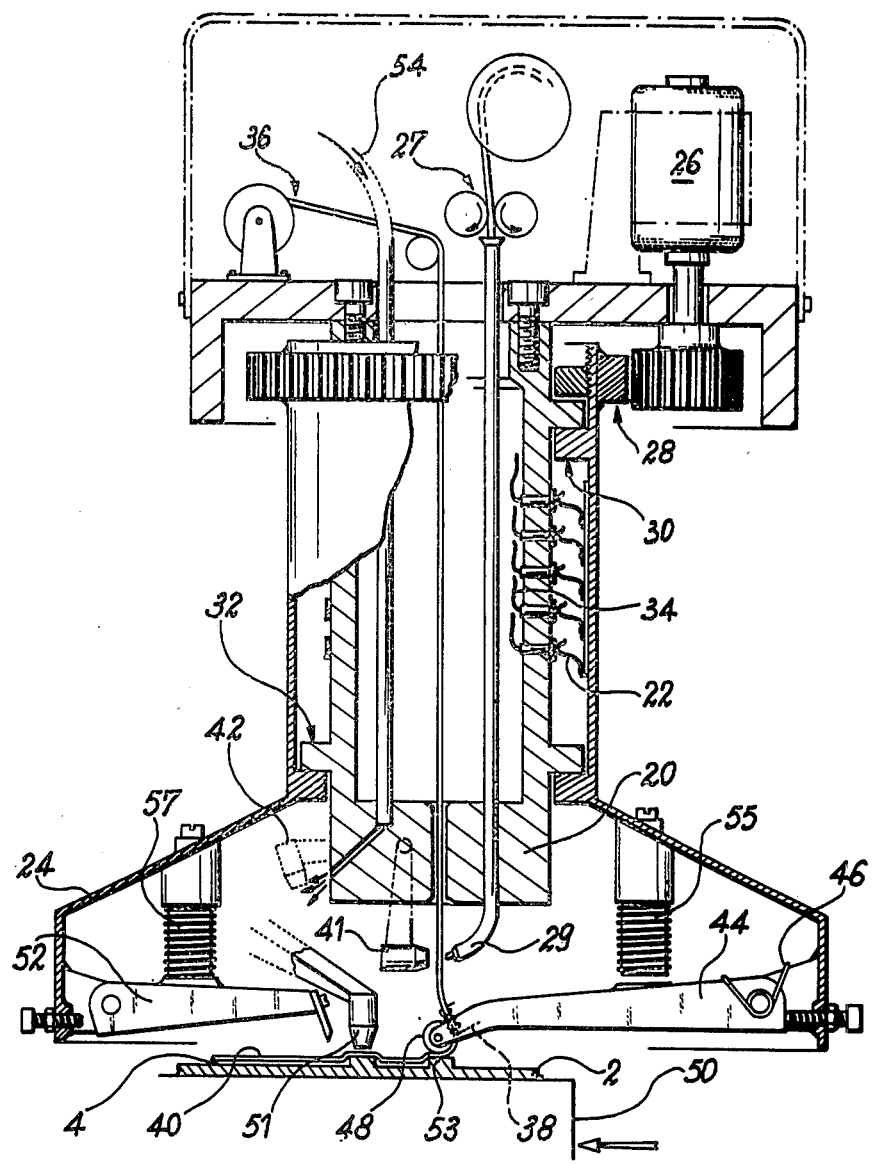
FIG. 2 is a general diagram of the rotary head of the device in accordance with the invention.

The diagram of FIG. 2 shows the rotary head in which are incorporated the devices for current supply, heating, stripping, tinning, soldering and cutting of the insulated wire. Said rotary head has a stationary central barrel 20 connected electrically to a rotatable frame 24 by means of rotary contacts such as the contact 22, said frame being driven by an electric motor 26 for producing action on a toothed wheel 28 which is rigidly fixed to said frame 24, this latter being coupled to the central barrel 20 by means of the bearings 30 and 32. The stationary frame 20 comprises a set of wires 34 for supplying electric current, an auxiliary system 36 for feeding insulated wire, a solder feed system 27 in which the strip of solder passes through a stationary tube 29, a stripping and tinning iron 41, as well as means for displacing said iron between the position shown in full lines and the position 42 (these positions being shown in greater detail in FIG. 4) and also the blower for directing the air delivered by the tube 54 onto the bit of the soldering iron in position 42.

An arm 44 is pivotally mounted on the rotatable frame 24 and fitted with a spring 46 which applies a laying-wheel 48 against the substrate 50. There are also mounted on the frame 24 a soldering iron 51 and a cut-off knife 52 which serve in one case to solder the wire 40 on the studs such as the stud 53 and in the other case to cut said wire after soldering. The arms 44 and 52 are driven by electromagnet devices designated respectively by the reference numerals 55 and 57. The bits of the soldering irons 41 and 51 will be described in greater detail hereinafter.

The operation of the rotary head of FIG. 2 is as follows : an automatic control system of the numerical type, for example, produces action on the different elements in a synchronized manner ; the control system actuates the motor 26 which orients the frame 24 in the desired direction of displacement of the wire. The wire is heated by the coil 38 immediately prior to insertion ; under the action of the control system, the bit of the soldering iron 41 strips the enamelled wire while applying to this latter a predetermined quantity of solder which is supplied through the tube 29. When this portion of the wire 40 arrives in the vicinity of the stud, its displacement is stopped by the XY table 50 and the control system applies the soldering iron 51 against the wire and the stud in order to form the soldered joint. Once the joint has been formed, the knife 52 cuts the wire. It is then possible by means of the motor 26 to initiate rotational displacement of the rotatable portion 24 of the head and to connect the insulated wire to a different stud, also by controlling the displacement of the XY table. Between two studs to be interconnected, the laying-wheel 48 inserts the wire 40 into the resin 4 of the support 2. The rotary head performs a movement of upward displacement in order to permit transfer to another stud.

Figure 3:
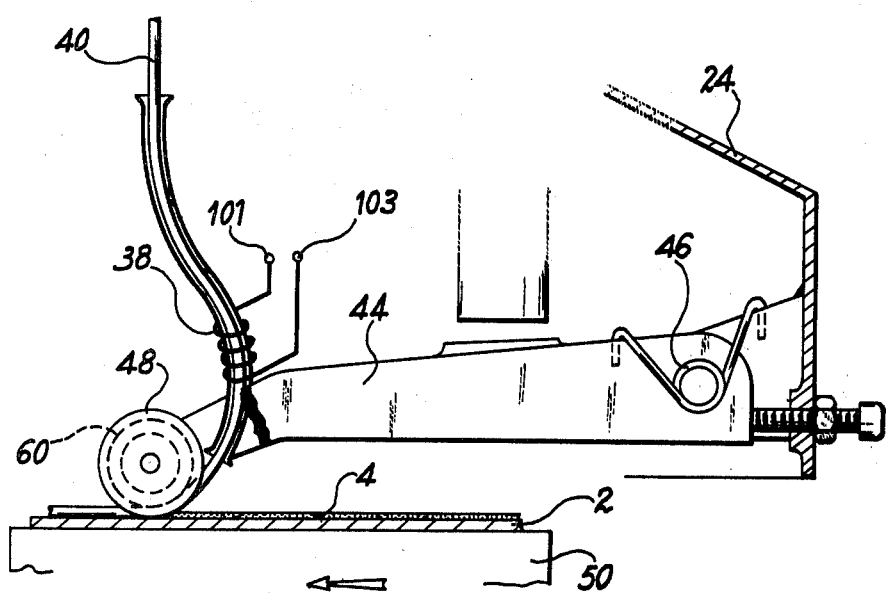
FIG. 3 shows the device in accordance with the invention for heating and bonding the insulated wire to the substrate.

FIG. 3 is a view to a larger scale showing the device for inserting and bonding the wire in the adhesive resin 4 on the support 2 which is fixed on the table 50. The arm 44 fitted with the laying-wheel 48 is connected elastically to the frame 24 by means of the spring 46 in order to apply the laying-wheel 48 with a certain degree of resilient force. The wire 40 is heated by a coil 38 to which current is applied between the terminals 101 and 103 just before insertion into the adhesive resin 4 of the substrate. By way of example, the laying-wheel has a diameter of 3 millimeters. The spring 46 ensures that the laying-wheel is resiliently applied under pressure so that the bonding should be carried out satisfactorily at the time of crossing of the wires.

The laying-wheel is covered with a deformable and antiadhesive elastic layer on the groove 60 which is in contact with the wire 40 in order to ensure that transmission of the movement of translation and rotation is effected by establishing a contact on the one hand between the groove and the support and on the other hand between said groove and the wire. In this manner, the wire is unwound without being subjected to any tensile stress which might otherwise result in tearing at the time of changes in direction.

The insertion of the wire 40 into the resin 4 is a function of the rate of translational motion, of the heating temperature of the wire 40, of the pressure exerted by the laying-wheel 48 on the substrate and on the nature of the adhesive (resin 4).

Figure 4:
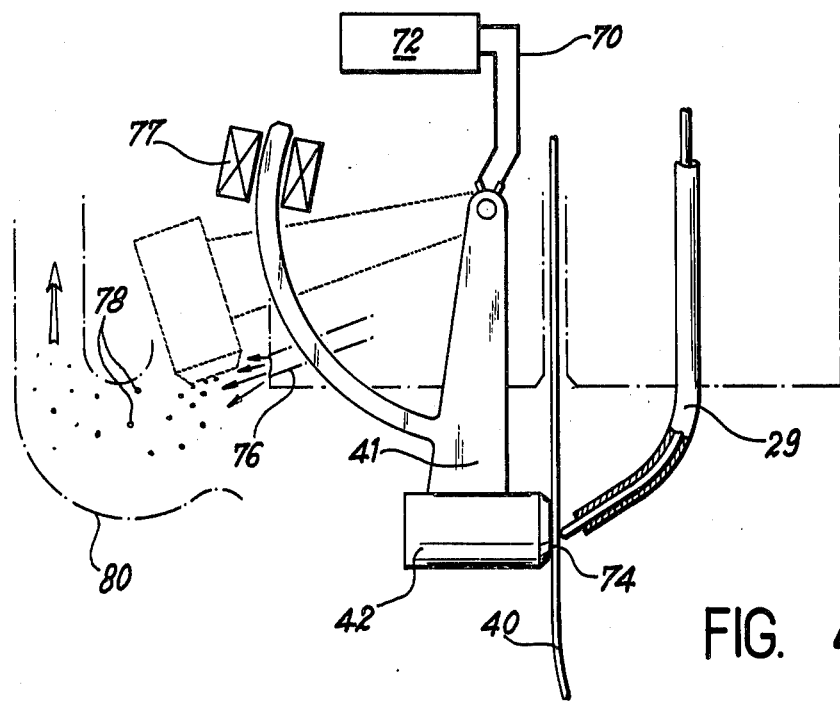
FIG. 4 is a diagram of the device for stripping and tinning the insulated wire.
Figure 6:
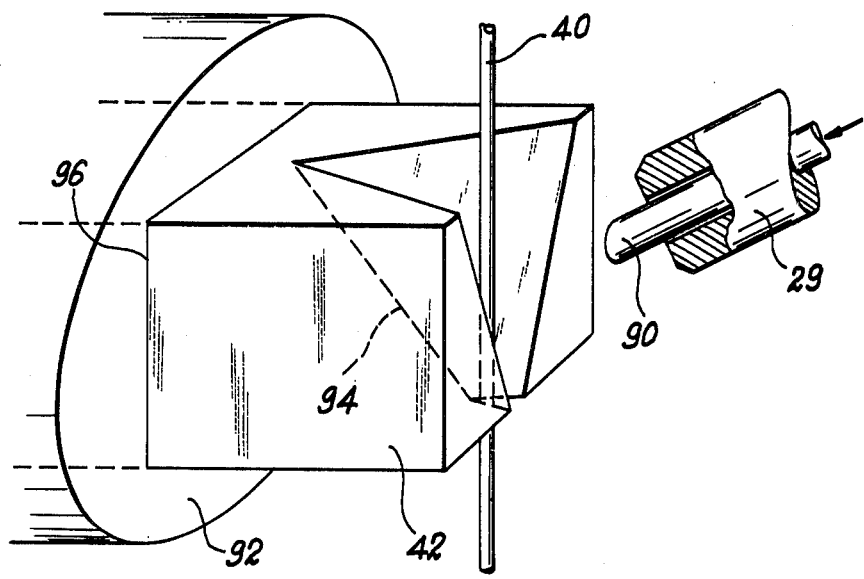
FIG. 6 is a view in perspective of the bit of the soldering iron for tinning and stripping the enamelled insulated wire.

The wire-stripping and tinning operation is carried out by means of a device shown in FIG. 4. This device comprises a soldering iron 41, the tip of which is constituted by a bit 42 of suitable shape as shown in FIG. 6. The heating unit which serves to heat the bit 42 is constituted by electric wires 70 which are connected to a supply 72. The bit 42 is shown in full lines in a first position in which it is in contact with the wire 40 to be stripped on the position 74; the solder contained in the tube 29 arrives in contact with the wire at the same level as the bit 42 in order to tin the wire and strip this latter at the same time. In a second position 42, the soldering iron is in the horizontal position and a nozzle 76 directs a jet of air onto the extremity of the bit in order to remove from this latter the lead-tin alloy in excess which is oxidized and can no longer be employed for the following stripping operation. Said lead-tin alloy contains residues of burnt enamel and is projected at 78 by the air jet discharged through the nozzle 76. The air jet is violent and lasts for only a very short period of time. The lead-tin particles are stored in the reservoir 80 which can either be emptied if necessary or replaced at regular intervals. Control of the stripping iron is effected by the electromagnet 77.

The stripping and tinning operation can be carried out on the wire 40 which is either moving or stationary according to the relative speeds of stripping and forward motion of the wire on the substrate 2. The length of wire to be stripped is dependent on the shape and the size of the bit of the soldering iron F, on the rate of feed of the wire and on the time of contact between the wire 40 and the bit 42. The bit is heated by Joule effect with temperature regulation. The external portion of the bit support is coated with a metal which protects this latter against oxidation at the continuous operating temperatures of 400° C. It must further be ensured that this layer of protective metal cannot be tinned and a layer of either stainless steel or chromium is accordingly chosen for this purpose.

Figure 5:
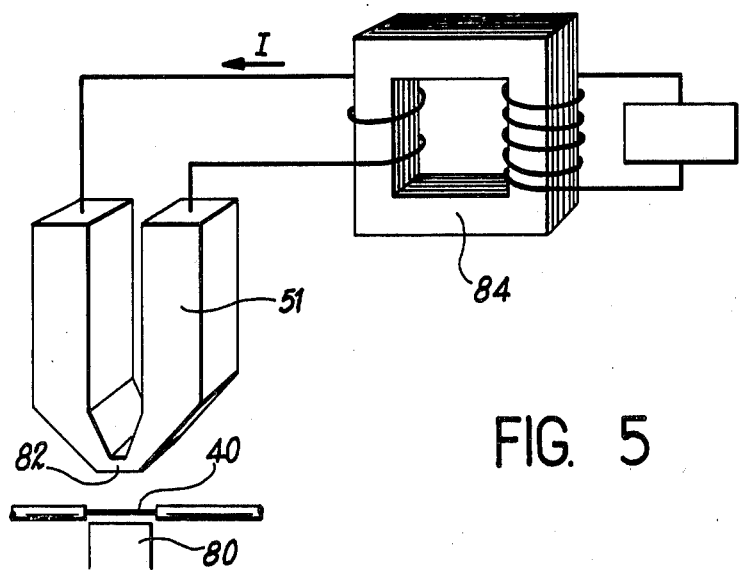
FIG. 5 is a diagram of the device for soldering the tinned wire onto the studs.

FIG. 5 shows the device for solvering the stripped and tinned wire 40 onto a stud 80 by means of the bit 51 which is driven by an electromagnet device (not shown in the figure). This device applies said bit 51 against the wire 40 and against the stud 80 in order to carry out soldering of said wire. The bit is heated directly by conduction since an alternating current I of predetermined duration and amplitude is passed through said bit. The heating system in this case is intermittent and the terminal inertia of the bit 51 must be as low as possible in order to ensure very rapid increase and decrease in the temperature of the bit 51. Said bit is cut so as to ensure that the heating zone 82 is given a shape which endows it with the highest resistivity. The heating circuit which delivers the current I is a voltage-reducing transformer 84 which makes it possible to obtain at the secondary a current of very high at low voltage. In order to reduce the volume of the air-gap, a fairly high frequency of 1000 c/s, for example, is employed. The bit 51 is driven by an electromagnet between two operating positions, namely a top position shown in FIG. 5 and a bottom position in which the wire 40 is applied against the stud 80 and soldered.

The bit 51 of the soldering iron is constituted by a non-tinnable substance which offers high chemical resistance and does not form oxides below 400° C, which has high thermal conductivity and good heat capacity. Preference is given to the use of either tungsten or molybdenum.

At the time of stripping, it is advantageous to treat a length of wire equal to twice the length L of a soldered joint (the tinned strip length is 2 L) with a view to saving time in the stripping operation. In fact, the wire is soldered beneath the first strip half, then cut and the second portion of the strip wire can be employed for soldering said wire onto another stud without further stripping and tinning.

After soldering, the wire is cut in immediate proximity to the bit 51 of the soldering iron. The cut-off knife is constituted by a steel blade or predetermined shape actuated by an electromagnet and capable of cutting the wire immediately after the soldered joint formed between this latter and the stud of the circuit.

The view of FIG. 6 shows the bit 42 which is employed for stripping and tinning the wire by means of the device illustrated in FIG. 4.

The heating unit 92 surrounds the bit 42, said unit being brought to a temperature of approximately 400° C by means of the supply 72 shown in FIG. 4. The bit 42 has the shape of a right-angled parallelepiped in which is cut a wedge-shaped recess formed by a dihedron, the edge 94 of which is inclined with respect to the edges 96 of the right-angled parallelepiped. The solder 90 (lead-tin solder) is transferred within the tube 29 to the level of the enamelled wire 40 under the action of the device 27 shown in FIG. 2. The bit 42 must be tinnable, must be capable of withstanding chemical erosion and must not dissolve in the lead-tin alloy in the course of time as is the case with copper. Said bit is formed of solid nickle or of copper coated with an electrodeposited layer of nickel-iron or of nickel of substantial thickness. The shape of the extremity of the bit is so designed that the volume of lead-tin alloy is small in comparison with the volume of the bit and does not flow under the action of gravity beneath the tip of the soldering iron (the wire being vertical). The wedge-shaped recess constituted by the dihedron forms a crucible which is narrowed towards the bottom. In the stripping position, the wire is imprisoned within the lead-tin volume contained in the recess of the bit 42.

Figure 7:
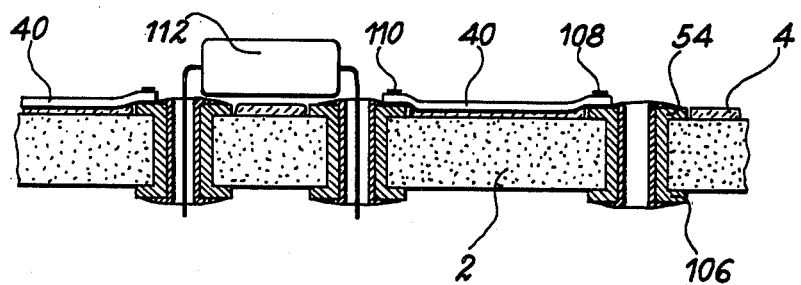
FIG. 7 is a sectional view of the support fitted with the connecting wires and the different electronic components in accordance with the invention.

FIG. 7 shows a cross-section of the support in accordance with the invention, the epoxy glass support 2 being coated with an adhesive thermosetting resin 4. The metallized holes are coated with a copper layer 54 and with a lead-tin layer 106 having a thickness of 20 $\mu$. The enamelled wire 40 interconnects two studs by means of the soldered joints 108 and 110 obtained in accordance with the invention. A component such as a resistor or a capacitor is inserted between two metallized holes such as the structure 112. The components such as 112 can be inserted in holes as shown in FIG. 7 or be soldered flatwise, in which case the components can be placed on both faces of the circuit and metallized holes are not employed. The procedure adopted in both cases follows conventional techniques for connecting components in printed circuits : the interconntection support which is formed in accordance with the present invention is in fact equivalent to a conventional printed circuit.

In an alternative embodiment of the invention, a laser is employed for soldering the insulated wires onto the connecting studs. In this instance, the laser head is mounted in the place of the soldering iron 51 next to the laying-wheel. In this alternative embodiment, the tinning and stripping means are dispensed with. Another noteworthy feature is that the cutting operation can also be performed by means of the laser ; this latter can be controlled in two different ways, namely in long pulses of small amplitude for soldering or in short pulses of substantial amplitude for cutting. Accordingly, the cutting means shown at 52 are also dispensed with.

Finally, bonding of the insulated wire may not entail the need for deposition of the adhesive layer over practically the entire support as contemplated in the embodiment described earlier.

In fact and in accordance with an alternative form of the invention, the machine comprises means for depositing the adhesive layer solely on the path of the insulated wire. By way of example, such means can consist of a bonding stylus which is controlled by the machine so as to come into contact with the support immediately before application of the wire. The adhesive can also be applied locally by means of the wire during unwinding of this latter.

In a final alternative embodiment, there is no deposition of an adhesive layer on the support and the insulated wire is coated in this case with a dry film which is made self-adhesive by a suitable preliminary treatment (heating or passing through a suitable solvent, for example).

I claim:

1. A method for forming an electrical circuit by joining together different conductive zones preforned on an insulating base comprising the steps of
   a. soldering an uninsulated end of a length of insulated wire to one of said zones,
   b. advancing said wire toward a second zone and stripping insulation off the portion of the wire which will engage the second zone,
   c. adhering the unstripped portion of the wire to the base as the wire is being advanced and when it contacts the base,
   d. placing the stripped portion of the wire on the second zone,
   e. soldering the stripped portion of the wire to the second zone, and
   f. cutting the wire to separate the portion thereof extending beyond the second zone.

2. The method in claim 1, wherein the step of adhering includes applying a layer of a thermosetting resin on all the base except for the conductive zones and heating and applying pressure to the wire for embedding the wire in the resin.

3. The method in claim 1, wherein the step of adhering includes applying adhesive on the base only n the path of the wire.

4. The method in claim 2, wherein the step of adhering further includes initially coating the adhesive on the wire and applying the adhesive to the base as the wire contacts the board.

5. A device for forming an electrical connection by means of insulated wires between conductive zones preformed on an insulating base support, wherein said device comprises:
   a. a horizontal table, means for rigidly connecting the base support to the table,
   b. moving and controlling means for moving and controlling the translational movements of the table in two perpendicular directions in the plane of the table,
   c. a head located above the table and including a stationary barrel and a rotatable frame coupled to said barrel,
   d. rotating and controlling means for rotating and controlling the rotation of the frame about an axis located perpendicular to the base support,
   e. feed means connected to the barrel for unwinding and feeding an insulated wire,
   f. stripping means connected to the board for stripping insulation of the wire in a controlled manner as a function of the position of the conductive zones to be connected,
   g. applying means connected to the frame for applying the wire on the support,
   h. soldering means connected to the frame for soldering the wire onto the conductive zones, and
   i. cutting means connected to the frame for cutting said wire after soldering.

6. A device according to claim 5, wherein said device further comprises tinning means for tinning the wire on the stripped portions thereof.

7. A heating device according to claim 5, wherein said device further comprises heating means for heating the wire prior to application on said support.

8. A device according to claim 6, wherein the stripping and tinning means includes a tinning soldering iron, a mechanism for bringing the soldering iron onto the wire to be stripped and a second mechanism for feeding a strip of solder and bringing said strip against said wire in the immediate vicinity of the point of application of the soldering iron.

9. A device according to claim 8, and further including a mechanism for displacing the tinning soldering iron between two successive operations on the wire, and a nozzle connected to a source of gas under pressure for directing a pulsed gas jet onto said soldering iron in the displaced position.

10. A device according to claim 8, wherein the tinning soldering iron includes a bit formed of a metal from the group consisting of nickel and copper, the bit beng coated with an electrodeposited layer of substantial thickness formed of a metal from the group consisting of nickel-iron alloy or nickel.

11. A device according to claim 8, wherein said soldering iron has a bit in the shape of a right-angled parallelepiped in which is cut a wedge-shaped recess in the form of a dihedron whose edge is inclined with respect to the edges of said right-angled parallelepiped.

12. A device according to claim 7, wherein the heating means includes a coil wound around the wire which is supplied with current, said coil being placed in the immediate vicinity of the point of application of the wire on the base support.

13. A device according to claim 5, wherein the applying means includes a wheel attached to the rotatable frame by means of a spring, the groove of the wheel being applied against the wire and formed of plastic material.

* * * * *